United States Patent [19]
Järisch et al.

[11] Patent Number: 4,895,447
[45] Date of Patent: Jan. 23, 1990

[54] PHASE-SENSITIVE INTERFEROMETRIC MASK-WAFER ALIGNMENT

[75] Inventors: Walter Järisch, Boeblingen; Günter Makosch, Sindelfingen, both of Fed. Rep. of Germany

[73] Assignee: International Business Machines Corporation, Armonk, N.Y.

[21] Appl. No.: 207,978

[22] Filed: Jun. 17, 1988

[30] Foreign Application Priority Data

Oct. 30, 1987 [EP] European Pat. Off. ............ 87115965

[51] Int. Cl.$^4$ .............................................. G01B 9/02
[52] U.S. Cl. ..................................... 356/356; 356/363
[58] Field of Search ............... 356/351, 356, 363, 400, 356/401

[56] References Cited

U.S. PATENT DOCUMENTS

| | | | |
|---|---|---|---|
| 4,429,992 | 2/1984 | Hausler et al. | 356/124 |
| 4,577,968 | 3/1986 | Makosch | 356/356 |
| 4,631,416 | 12/1986 | Trutna, Jr. | 250/548 |
| 4,636,626 | 1/1987 | Hazama et al. | 250/201 |
| 4,656,347 | 4/1987 | Une et al. | 250/201 |
| 4,710,026 | 12/1987 | Magome et al. | 356/349 |
| 4,714,348 | 12/1987 | Makosch | 356/351 |
| 4,764,014 | 8/1988 | Makosch et al. | 356/356 X |

FOREIGN PATENT DOCUMENTS

| | | |
|---|---|---|
| 0040700 | 12/1981 | European Pat. Off. |
| 0045321 | 2/1982 | European Pat. Off. |
| 3715864 | 11/1987 | Fed. Rep. of Germany ...... 356/356 |
| 8504266 | 9/1985 | World Int. Prop. O. |

OTHER PUBLICATIONS

Makosch, G. et al., "Phase-Locked Interferometry for Automatic Mask Alignment in Projection Printers", *"Applied Optics"*, vol. 26, No. 14, Jul. 15, 1987, pp. 2823–2835.

Makosch G. et al., "Interferometric Method for Checking the Mask Alignment Precision in the Lithographic Process", *"Applied Optics"*, vol. 23, No. 4, Feb. 15, 1984, pp. 628–632.

Itoh, J. et al., "A New Interferometeric Displacement-Detection Method for Mask to Wafer . . .", Jap. Journ. of Appl. Phys., vol. 25, No. 6, Jun. 1986, pp. L487–L489.

Makosch, G. et al., "Surface Profiling by Electro-Optical Phase Measurements", Spie, vol. 316 High Resolution Soft X-Ray Optics (1981), pp. 42–53.

Une, A. et al., "A Highly Accurate Alignment Technique Using a Dual Grating", Bull. Japan Soc. of Prec. Eng., vol. 19, No. 1 (Mar. 1985), pp. 71–72.

*Primary Examiner*—Davis L. Willis
*Assistant Examiner*—Matthew W. Koren
*Attorney, Agent, or Firm*—M. D. Schechter

[57] ABSTRACT

In an alignment method for lithographic devices of the proximity printing type two light beams (9a,d;9b,c) are made to impinge symmetrically on gratings (3) associated to each alignment direction on mask (1) and wafer (2) such that diffracted beams return along the optical axis of the alignment system. The relative phase of the diffracted beams is measured with a phase compensation technique using an electro-optic modulator (15). The alignment method is performed in two steps, the first being a normalizing step where a smooth portion of the wafer is brought under the alignment grating in the fixed mask (2) and a measuring step yielding the phase difference as a position control signal when the alignment grating on the wafer has been brought under the alignment grating of the mask. The four partial beams required for alignment in two orthogonal directions are generated from a single laser beam (15) in a compact set (14) of birefringent crystals or Wollaston plates and half-wave retarders.

23 Claims, 4 Drawing Sheets

PHASE-SENSITIVE INTERFEROMETRIC MASK-WAFER ALIGNMENT

FIELD OF THE INVENTION

The invention relates to a method and an apparatus for aligning two parallel objects in different planes, in particular a mask with respect to a wafer in lithographic systems, preferably of the proximity printing type using corpuscular beams or X-rays. A novel optical beam separation device used in such an apparatus can be applied in other optical devices as well.

BACKGROUND OF THE INVENTION

In the manufacture of integrated circuits by lithographic methods exposure masks must be aligned (or registered) relative to structures on the wafer with an accuracy that is only a fraction of the smallest structural detail in the mask. In present photolithographic methods with smallest line widths on the order of 1 micron alignment accuracies of 0.3 micron can be achieved with manual or automatic alignment methods using suitably shaped alignment marks on mask and wafer.

The further decrease of line width to some tenths of a micrometer which is expected from corpuscular beam and X-ray lithography over the next years will thus require alignment accuracies in the order of nanometers. Additionally, alignment must be performed in short times (typically less than a second) for high throughput in the production line, in particular when large wafers are exposed in the step-and-repeat-mode where each position requires its own alignment. Conventional visual methods cannot meet these requirements for accuracy and speed.

One approach that has been discussed in the art to achieve high accuracy uses optical gratings as registration marks on mask and wafer and derives the registration control signal from light diffracted at these gratings. Accuracies in the nanometer range can then be achieved if the evaluation process is based on phase sensitive methods as described in U.S. Pat. No. 4,577,968 (corresponding to European Pat. No. 45321) or in an article by G. Makosch and B. Solf entitled "Surface profiling by electro-optical phase measurements" (*Proc. Soc. Photo-opt. Instrum. Eng.*, Vol. 316, pages 42–53, 1981). This prior system is, however, conceived for photolithographic printers of the projection type where an optical imaging system is interposed between mask and wafer. It thus cannot be used in proximity printing systems with mask-wafer separations on the order of between 50 and 100 microns.

Alignment techniques using optical gratings on mask and wafer in an x-ray exposure system of the proximity printing type have been described by A. Une, et al in an article entitled "A Highly Accurate Alignment Technique Using a Dual Grating" (*Bull. Japan Soc. of Prec. Engg.*, Vol. 19, No. 1, pages 71 and 72, March 1985), and by J. Ito and T. Kanayama in an article entitled "A New Interferometric Displacement-Detection Method for Mask-to-Wafer Alignment Using Symmetrically-Arranged Three Grating" (*Japanese Journal of Applied Physics*, Vol. 25, No. 6, June 1986, pages L487–L489). These techniques evaluate the intensities of different diffraction orders and might therefore encounter difficulties in practical use when the wafer is covered with various layers in different processing steps that may change the reflectivity and give rise to interference effects disturbing the measured intensity.

SUMMARY OF THE INVENTION

It is therefore an object of the present invention to provide an improved alignment method and apparatus, in particular for lithographic systems of the proximity printing type, which yield alignment accuracies in the nanometer range, which can be automated with high speed, and which are insensitive to intensity variations of the diffracted light.

Briefly, the method according to the invention is based on an interferometric technique which measure the phase shift of a light wave after diffraction at a grating. This phase shift is proportional to the lateral displacement of the grating and can be determined with great precision by introducing a compensating phase shift in an electro-optic crystal.

In the first (or gauging) step of the method according to the invention the phase of the light wave is determined with the spatially fixed grating in the mask being located over a blank area of the wafer. The second phase measurement is taken when the wafer alignment grating has been brought into near alignment to the mask (deviation less than $g/4$, $g$ being the grating constant). The alignment or position control signal is then the relative phase difference between the two measurements.

The gratings on mask and wafer can be linear gratings if alignment is to be performed for one coordinate direction only or crossed gratings for simultaneous alignment in the x- and y- directions.

An apparatus to carry out alignment in two dimensions uses an arrangement of birefringent or Wollaston crystals that generate the required four parallel partial beams with polarization directions appropriate for phase sensitive signal evaluation. This beam splitting arrangement can be used in other optical systems as well where four parallel partial beams are required. One field of application is in optical distortion testers for photolithographic masks.

PREFERRED EMBODIMENT OF THE INVENTION

Figure 1:
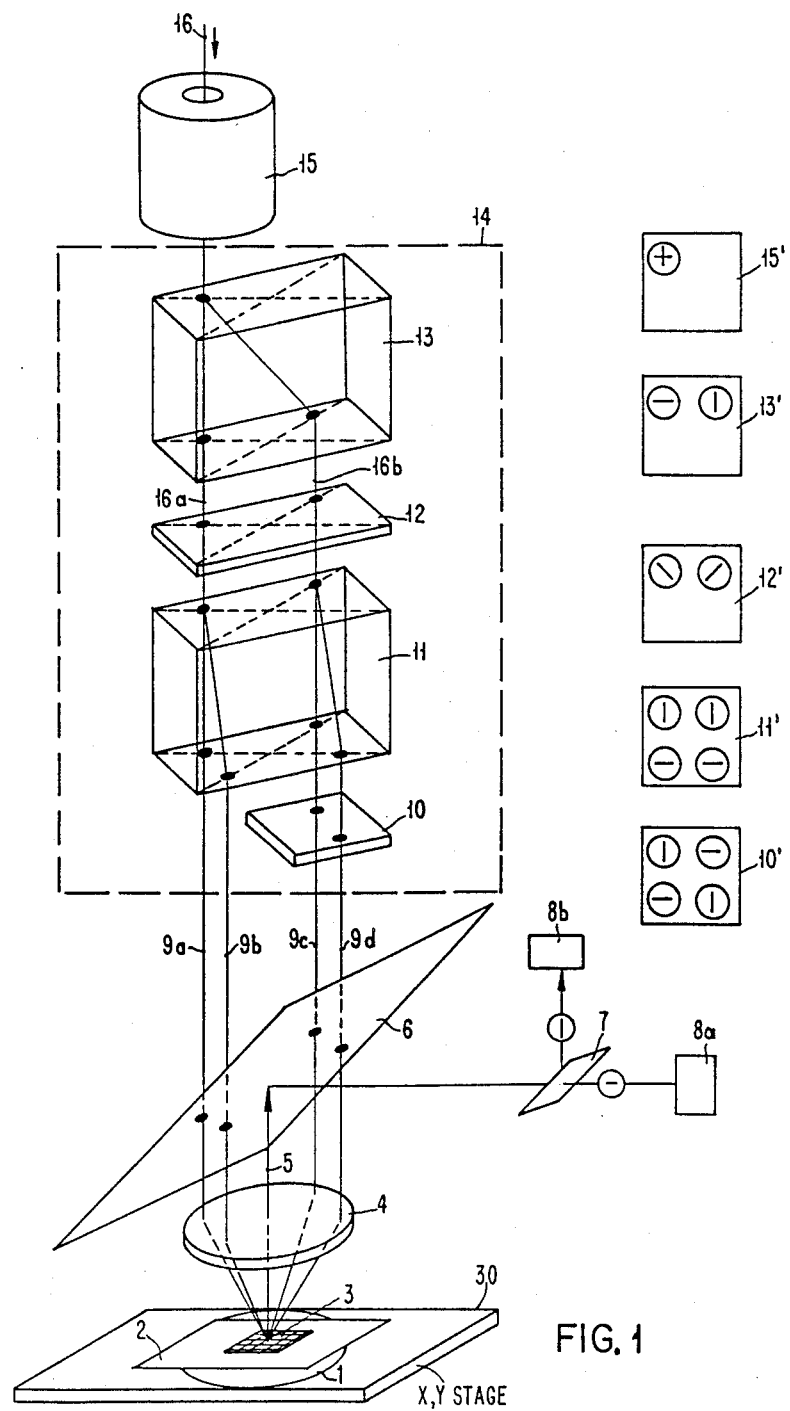
FIG. 1 shows a schematic diagram of the optical alignment system in accordance with the invention.

FIG. 1 shows a schematic drawing of a novel optical system that can be used to carry out the method of the invention.

A wafer 1 is mounted on a x, y-stage 30 (schematically shown) for exposure in the step-and-repeat mode through mask 2 which is held stationary with respect to the exposing beam and parallel to wafer 1 with a separation on the order of between 20 and 100 microns. The exposing beams may be light, X-rays or corpuscular beams. Wafer 1 is covered with a photoresist layer and in most cases with other layers applied in previous manufacturing steps. Before each exposure wafer 1 must be controllably displaced for alignment with the fixed mask, e.g. by accurate micromanipulators. For mask 2 and each area of wafer 1 onto which the shadow of mask 2 is to be projected in the proximity printing process the invention proposes gratings 3 as registration marks. In the case of one-dimensional alignment, linear gratings are used which are parallel to each other on the mask and the wafer. In the case of two-dimensional alignment, crossed gratings are provided. The grating constant g is typically on the order of 10 microns to achieve the desired alignment accuracy in the nanometer range.

Before interferometric alignment according to the invention is performed, wafer 1 has to be aligned to its nominal position within g/4, e.g. within an accuracy in the micron range. This is easily achievable with conventional methods, e.g. by displacing the interferometer controlled x, y-stage on which wafer 1 is mounted.

For the alignment method of the invention grating 3 on the mask is symmetrically illuminated by two pairs of light beams 9a, 9d, and 9b, 9c, respectively. Each pair of beams spans a plane that is perpendicular to the plane of the other pair. All beams are linearly polarized, the polarization directions in one pair being perpendicular to the polarization of the other beam pair. A lens 4 focusses beams 9 onto grating 3. The focal length and grating constant are chosen such that the diffracted beams 5 return along the optical axis of lens 4 to be deflected by semi-transparent mirror 6 onto a polarizing beam splitter 7 which separates the mutually orthogonal polarization directions of the diffracted beams to detectors 8a and 8b, respectively.

Beams 9 are generated from a linearly polarized laser beam 16 which traverses an electro-optical phase modulator 15, where two colinear, partial beams with mutually orthogonal polarization directions are created. The polarized beams enter an optical beam separation arrangement 14 with a calcite crystal 13 to be spatially separated into partial beams 16a and 16b. (The polarization directions are symbolically indicated on the right of FIG. 1, where reference numeral 15' shows the unseparated polarized beams at the exit of modulator 15, reference numeral 13' the separated beams at the exit of calcite crystal 13 and so on.)

Partial beams 16a and 16b then pass quarter-wave retardation plate 12 which rotates the polarization directions by 45 degrees for further spatial splitting in calcite crystal 11 having the same length as crystal 13. At the exit of crystal 11 four partial beams 9 are produced, two of which pass a half-wave retardation plate 10 to rotate their polarization directions by 90 degrees. The resulting partial beams 9a, 9b, 9c, and 9d are therefore arranged at the corners of a square 10' such that diagonally opposite beams (e.g. 9a and 9d) have the same direction of polarization perpendicular to the polarization of the beam pair (9b and 9c) on the other diagonal. Activation of modulator 15 will thus modulate the phase difference within each pair of diagonal beams.

In this arrangement the two beams diffracted at one set of parallel bars in the crossed grating 3 will thus have a polarization different from those diffracted at the orthogonal sets of bars and can be separated by polarizing beam splitter 7 as indicated by the polarization symbols in the beam paths of FIG. 1. Measuring the phase of the light beams received by detectors 8a and 8b yields the desired alignment control signals, as will be explained in detail below. The method to measure the phase is known in itself and is described, for example, in the above-noted article by Makosch and Solf; it is based on compensating the diffraction introduced phase shift by periodically modulating electro-optic crystal 15.

Figure 2A:
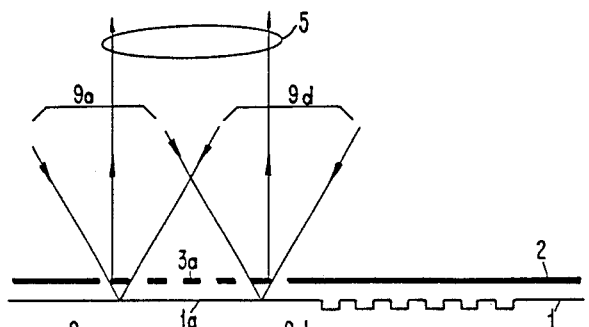
FIGS. 2A and 2B show the relative position of mask and wafer when the gauging and the measurement steps, respectively, of the alignment method in accordance with the invention are performed.
Figure 2B:
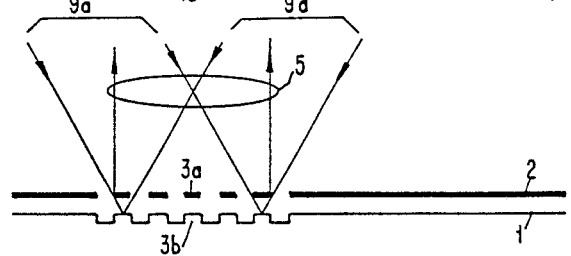

The alignment method of the invention is carried out in two steps:

Step 1 (FIG. 2A): A blank (or unstructured) part 1a, e.g. a kerf zone of wafer 1, is brought under alignment grating 3a of mask 2 before the mask grating is symmetrically illuminated by partial beams 9a and 9d (in the one-dimensional case shown in FIG. 2). The phase of diffracted beams 5 travelling along the optical axis is then determined by electro-optic modulation to serve as reference value (preferably set to zero) for the actual measurement step of FIG. 2b.

Step 2 (FIG. 2B): Alignment grating 3b on wafer 1 is brought under mask grating 3a with an accuracy of better than ±g/4 before the phase of diffracted beam 5 is measured again. This second phase measurement represents the misalignment such that alignment is to be continued until a phase difference of zero is measured in this second step.

Figure 3A:
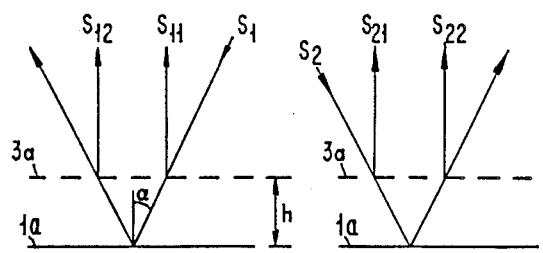
FIGS. 3A and 3B show schematic diagrams of the incident and the diffracted beams in the two measurement steps of the alignment method according to the invention.
Figure 3B:
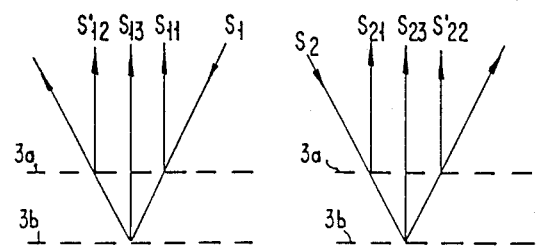
Figure 4A:
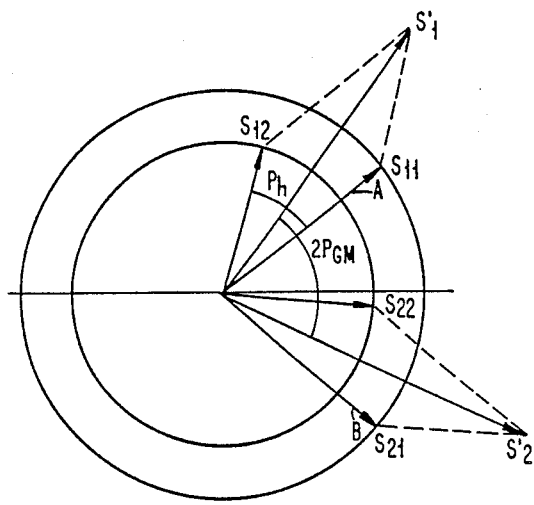
FIGS. 4A, 4B and 4C show schematic vector diagrams to indicate the phase relationship between the beams of FIGS. 3A and 3B.
Figure 4B:
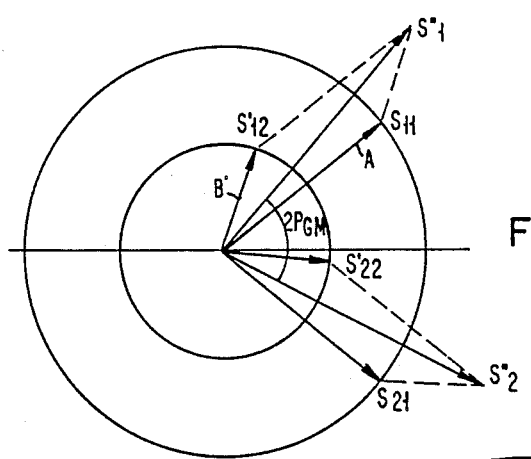
Figure 4C:
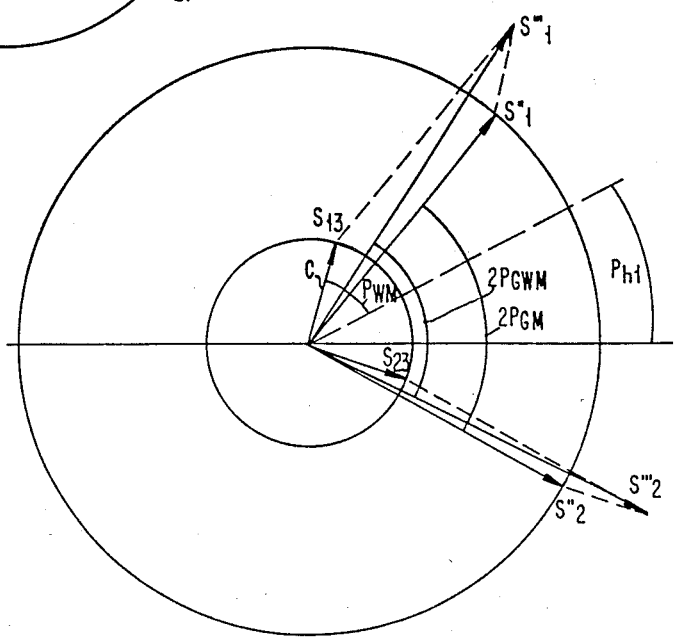

FIGS. 3A and 3B show in greater detail the diffracted beams which are generated in the above described two measurement steps. FIGS. 4A–4C show vector diagrams to illustrate the phase relationships between these beams.

The symmetrically incident beams $S_1$ and $S_2$ with the same polarization direction are first reflected at mask grating 3a to produce two diffracted beams as $S_{11}$ and $S_{21}$. The incident beams are also reflected at blank wafer 1 to pass grating 3a in transmission to produce two further diffracted beams $S_{12}$ and $S_{22}$. In complex notation these diffracted beams are expressed as follows:

$$S_{11} = Ae^{i(P_{GM}+P/2)} \tag{1}$$

$$S_{12} = Be^{iP_h}e^{i(P_{GM}+P/2)} \tag{2}$$

$$S_{21} = Ae^{-i(P_{GM}+P/2)} \tag{3}$$

$$S_{22} = Be^{iP_h}e^{-i(P_{GM}+P/2)} \tag{4}$$

where A and B are the amplitudes of the incident beams, $P_{GM}$ is the phase shift due to the lateral displacement $\Delta X$ of the mask grating relative to an arbitrary initial position of the mask grating ($P_{GM}=2\pi(\Delta X)/g$), $P_h$ is the phase shift due to the air gap h between the mask and the wafer ($P_h=4\pi h \cos(\alpha/\lambda)$), and P is the phase shift in the phase modulator.

FIG. 4A represents the vectors of the individual beams present in step 1 of the aligning method. The phase shift P introduced by the modulator has been set to P=0 for the sake of simplicity.

The two resultants $S_1'$ and $S_2'$ represent the superposition of the first diffraction orders generated from incident beam $S_1$ and $S_2$, respectively. Other diffraction orders may be chosen as well. The angular difference $2P_{GM}$ between the resultants $S_1'$, $S_2'$ is measured with the above-mentioned phase compensation method.

Superposition of these diffracted beams (which all have the same polarization direction) yields the output beam S (reference numeral 5 in FIG. 1)

$$S = S_{11} + S_{12} + S_{21} + S_{22} = 2[\cos(P_{GM} + P/2)](A + Be^{(iPh)}) \quad (5)$$

The intensity of output beam 5 is thus:

$$J = |S|^2 = 2(A^2 + B^2 + 2AB\cos P_h)(1 + \cos(2P_{GM} + P)) \quad (6)$$

This equation represents a harmonic function whose amplitude varies with the distance between the mask and the wafer. The phase term $2P_{GM}$ represents the lateral displacement $\Delta X$ of the mask from an arbitrary initial position according to $P_{GM} = 2\pi(\Delta X)/g$. It is to be noted that this phase shift $P_{GM}$ is independent of the mask-wafer separation h. This is in contrast to alignment methods based on the evaluation of the diffracted amplitude J which is indeed dependent on h!

After the blank wafer surface of measurement step 1 has been replaced by wafer alignment grating 3b (FIG. 3B) two additional orders of diffraction $S_{13}$ and $S_{23}$ are generated and introduce an additional phase shift; the phase difference measured in step 1 is therefore changed if mask and wafer are not exactly aligned relative to each other.

FIG. 4B shows how the diagram of FIG. 4A is modified after the blank wafer area 1a has been replaced by the wafer grating area 3b, and if the new diffraction orders generated by the wafer grating are not yet considered. The amplitudes of the diffracted beams $S_{12}$ and $S_{22}$ are decreased such that $S_1'$ and $S_2'$ of FIG. 4A are rotated without a change in their angular distance $2P_{GM}$ into vectors $S''_1$ and $S''_2$.

In complex notation, the diffracted beams are then expressed as:

$$S_{12} = Be^{(iPh)}e^{(iPGM)} \quad (7)$$

$$S_{22} = Be^{(iPh)}e^{(-PGM)} \quad (8)$$

FIG. 4C represents the final vector diagram in which the additional beams $S_{13}$ and $S_{23}$ diffracted at mask grating 3a are considered. They are expressed as:

$$S_{13} = Ce^{(iPh1)}e^{(iPWM)} \quad (9)$$

$$S_{23} = Ce^{(iPh1)}e^{(-iPWM)} \quad (10)$$

where $P_{h1}$ is the phase shift of the new diffracted beam due to air gap h, and $P_{WM}$ is the phase shift introduced by lateral displacement of wafer grating 3b relative to the same arbitrary initial position of the mask grating.

The new resultants are now $S_1'''$ and $S_2'''$ with an angular separation of distance $2P_{GWM}$ which is measurable by the phase compensation method.

The measurable phase angle ($P_{GM}$ in step 1 and $P_{GWM}$ in step 2 of the proposed method) are only identical, if the mask displacement coincides with the wafer displacement. If the value of $P_{GM}$ is used as a reference value (and set to zero), then the mask and wafer are aligned by moving the wafer until $P_{GMW}$ becomes zero as well.

The measured phase angle $P_{GWM}$ in step 2 therefore represents a measure of alignment deviations between mask and wafer. The relationship, is however, not linear, as can be shown by calculating the intensity of the superimposed means shown in FIG. 4C. The measured light intensity J can then be expressed as $$J = E + F\cos^2(P_{GWM} + P/2) \quad (11)$$

The continuously measured phase angle $P_{GWM}$ is identical to $P_{GM}$ only if the alignment condition $P_{GM} = P_{GWM}$ has been achieved by suitable displacement of the wafer.

Figure 5:
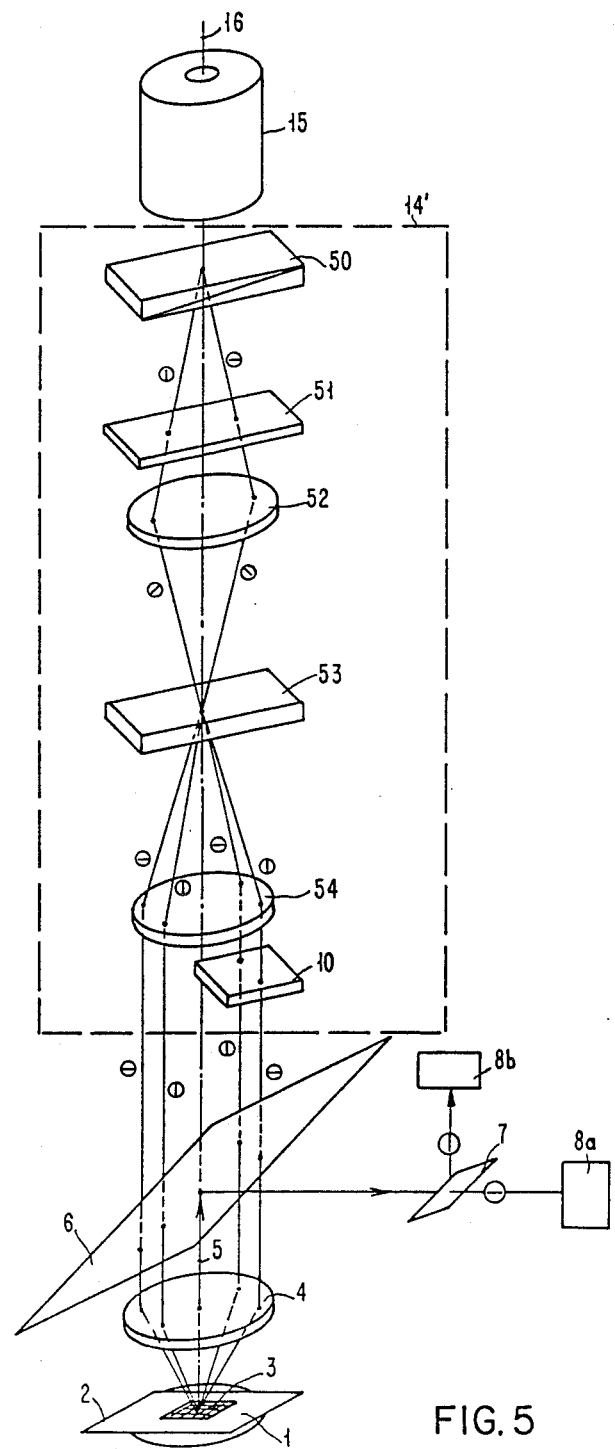
FIG. 5 shows an alternate embodiment of the optical alignment system in accordance with the invention.

FIG. 5 shows another embodiment of a beam-splitter arrangement 14' that generates two pairs of beams, such that the beams in each pair have the same polarization direction perpendicular to the beams in the other pair and span one of two orthogonal planes. The output beam of modulator 15 is focussed on a first Wollaston prism 50 to be split symmetrically into beams with perpendicular directions of polarizations which are then rotated by 45 degrees in quarter-wave plate 51. A lens 52 focusses the divergent beams onto a second Wollaston prism 53, which is crossed with respect to the first Wollaston prism 50 and generates four symmetrical beams impinging on a second collimating lens 54. Half-wave retardation plate 10 rotates the polarization directions of the left-hand beams in FIG. 5 to provide the desired polarization pattern in the four beams.

The other elements of FIG. 5 correspond to those of FIG. 1 and have the same reference numerals. The polarization directions of the beams are indicated in FIG. 5 in the conventional way. The symmetry of the beam paths in FIG. 5 relative to the optical axis makes them easier to adjust than in the FIG. 1 embodiment.

The beam splitter arrangements 14 in FIG. 1 and 14' in FIG. 5 can be used in other optical set-ups as well, where four partial beams with selectable polarization directions are required (the relative polarizations can be adjusted by appropriate choice of wave retarding plates 10 for individual beams).

The beam splitter arrangements 14 and 14' are particularly suited for an optical distortion tester, as described in U.S. Pat. No. 4,429,992 (corresponding to European Patent No. 40700), to generate two pairs of polarized beams; these beams are directed via a roof top prism to four separate beam expanders from which they impinge symmetrically on a test object, e.g. a photo mask with grating like patterns. After diffraction the beams return in the direction vertical to the object. For high sensitivity, high diffraction orders are preferred. In this particular application half-wave plate 10 is composed of two parts with different orientations such that all four partial beams 9a–9d have their polarization directions in one plane.

We claim:

1. Method for aligning two parallel objects (1,2) in different planes, each object carrying an optical grating to diffract light beams with symmetrical incidence into a direction normal to the surface of the objects, the phase of the diffracted beams being analyzed by electro-optic phase compensation, characterized in that the following steps are performed in a lithographic system of the proximity printing type:

determine the phase of the diffracted beams (5) for at least one alignment direction when the alignment grating (3a) of one object (2) is positioned over a smooth surface of the other object (1), determine the phase of the diffracted beams (5) for each alignment direction after the grating (3b) of the second object has been brought under the alignment grating (3a) of the first object with an alignment accuracy of better than g/4, g being the constant of the gratings,
apply the relative phase of the second measurement step as position control signal to displace one of the objects.

2. The method of claim 1, wherein for each alignment direction one pair of symmetrically incident polarized beams (9a,d;9b,c) is provided, the polarization directions of both pairs being opposite, and wherein the diffracted beams are separated according to their polarization direction for independent alignment measurement in two dimensions.

3. The method of claim 1 or 2, wherein the diffracted beams are of the first diffraction order.

4. The method of claim 1 or 2, wherein the alignement gratings have equal grating constants in the order of 10 microns.

5. The method of claim 1 or 2, used in X-ray projection lithography.

6. Apparatus for aligning two parallel objects in different planes, each carrying an identical optical grating (3) as alignment mark, the apparatus comprising:
   an electro-optic modulator (15) to generate two modulated beams with orthogonal polarization from a linearly polarized laser beam (16)
   a beam splitter means (14) generating two pairs of beams (9), each pair (9a,d;9b,c) having the same direction of polarization perpendicular to the polarization of the other pair and spanning a plane that is orthogonal to the plane of the other pair
   means (4) to focus the partial beams symmetrically on a common point on the alignment grating (3)
   diffraction means (6) to direct the diffracted beams (5) to a polarized beam splitter (7) separating the polarization directions to associated detector means (8a,b)
   electro-optic phase evaluation means associated to each detector means (8a,b).

7. An apparatus as claimed in claim 6, characterized in that the beam splitter means comprises in sequence along its optical path:
   a first birefringent crystal (13) to separate a beam of light (16) into two partial beams (16a, 16b) with orthogonal polarization directions
   a quarter-wave beam retarder (12) rotating the polarization planes of both partial beams by 45 degrees
   a second birefringent crystal (11) to separate each partial beam into two further partial beams (9a–9d)
   half- or quarter-wave retarders in the path of selected partial beams.

8. An apparatus as claimed in claim 6, characterized in that the beam splitter means comprises in sequence along its optical path:
   a first Wollaston prism (50) to symmetrically separate a beam of light (16) into two partial beams with orthogonal polarization direction
   a quarter-wave beam retarder (51) rotating the polarization planes of both partial beams by 45 degrees
   a first collecting lens (52)
   a second Wollaston prism (53), arranged in the focus of the first lens (52) and crossed with respect to the first Wollaston prism (50), to separate each partial beam into two further partial beams
   a second collecting lens (54) to collimate the partial beams emerging from the second Wollaston prism (53)
   half or quarter wave retarders in the path of selected partial beams.

9. A method of aligning first and second objects in an alignment direction, said first and second objects being parallel to each other and in different planes, said first object having an optical grating portion extending in the alignment direction, said second object having an optical grating portion extending in the alignment direction and having an optically smooth portion, said gratings having grating constants, said method comprising the steps of:
   positioning the optical grating portion of the first object over the optically smooth portion of the second object;
   directing a first radiation beam through the optical grating portion of the first object and onto the optically smooth portion of the second object from a first direction to produce a first diffracted beam;
   directing a second radiation beam through the optical grating portion of the first object and onto the optically smooth portion of the second object from a second direction different from the first direction to produce a second diffracted beam;
   combining the first and second diffracted beams;
   measuring the phase of the combined first and second diffracted beams to produce a reference phase measurement;
   positioning the optical grating portion of the first object over the optical grating portion of the second object;
   directing a third radiation beam through the optical grating portion of the first object and onto the optical grating portion of the second object from a third direction to produce a third diffracted beam;
   directing a fourth radiation beam through the optical grating portion of the first object and onto the optical grating portion of the second object from a fourth direction different from the third direction to produce a fourth diffracted beam;
   combining the third and fourth diffracted beams;
   measuring the phase of the combined third and fourth diffracted beams to produce a control phase measurement;
   comparing the control phase measurement with the reference phase measurement to produce a comparison phase measurement; and
   moving the second object relative to the first object in the alignment direction until the comparison phase measurement is a selected value.

10. A method as claimed in claim 9, characterized in that the second object is moved relative to the first object in the alignment direction until the control phase measurement is substantially equal to the reference phase measurement.

11. A method as claimed in claim 10, characterized in that:
   the first and third directions are equal to each other;
   the second and fourth directions are equal to each other; and
   the first and third directions have a component in the alignment direction.

12. A method as claimed in claim 11, characterized in that:
   the grating portions of the first and second objects have substantially equal grating constants; and
   the step of positioning the optical grating portion of the first object over the optical grating portion of the second object further comprises the step of aligning the grating portions in at least the alignment direction to within one-fourth of the grating constant.

13. A method as claimed in claim 12, characterized in that the first and second objects are spaced apart by less than approximately 100 microns.

14. A method as claimed in claim 13, characterized in that the first and second radiation beams are linearly polarized in the same direction.

15. A method as claimed in claim 14, characterized in that:
the first and third diffracted beams are of a positive diffraction order; and
the second and fourth diffracted beams are not a positive diffraction order.

16. An apparatus for aligning first and second objects in an alignment direction, said first and second objects being parallel to each other and in different planes, said first object having an optical grating portion extending in the alignment direction, said second object having an optical grating portion extending in the alignment direction and having an optically smooth portion, said gratings having grating constants, said apparatus comprising:
a source of first and second radiation beams;
means for directing the first and second radiation beams in different directions through the optical grating portion of the first object and onto the second object to produce first and second diffracted beams;
means for combining the first and second diffracted beams; and
means for measuring the phase of the combined first and second diffracted beams to produce a phase measurement.

17. An apparatus as claimed in claim 16, further comprising:
means for comparing the phase measurement with a reference phase measurement to produce a comparison phase measurement; and
means for moving the second object relative to the first object in the alignment direction until the comparison phase measurement is a selected value.

18. An apparatus as claimed in claim 17, characterized in that:
the first and second radiation beams are spatially separated in the first direction and lie substantially in a first plane; and
the source of the first and second radiation beams comprises:
a source of a linearly polarized collimated radiation beam;
an electrooptic modulator arranged to receive the linearly polarized collimated radiation beam and to produce a modulated radiation beam; and
a beam splitter arranged to receive the modulated radiation beam and to generate first and second modulated output beams having the same polarization.

19. An apparatus as claimed in claim 18, characterized in that:
the beam splitter further generates third and fourth modulated output beams having polarizations perpendicular to the polarization of the first and second modulated output beams, said third and fourth modulated output beams lying substantially in a second plane which is substantially perpendicular to the first plane; and
the apparatus further comprises:
means for directing the third and fourth radiation beams in different directions through the optical grating portion of the first object and onto the second object to produce third and fourth diffracted beams; and
means for measuring the phase difference between the third and fourth diffracted beams to produce a second phase measurement.

20. An apparatus as claimed in claim 19, characterized in that:
the two measuring means comprise separation means for separating the first and second diffracted beams from the third and fourth diffracted beams.

21. A method of aligning first and second objects in an alignment direction, said first and second objects being parallel to each other and in different planes, said first object having an optical grating portion extending in the alignment direction, said second object having an optical grating portion extending in the alignment direction and having an optical smooth portion, said gratings having grating constants, said method comprising the steps of:
positioning the optical grating portion of the first object over the optically smooth portion of the second object;
directing a first radiation beam through the optical grating portion of the first object and onto the optically smooth portion of the second object from a first direction to produce a first diffracted beam;
directing a second radiation beam through the optical grating portion of the first object and onto the optically smooth portion of the second object from a second direction different from the first direction to produce a second diffracted beam;
measuring the phase difference between the first and second diffracted beams to produce a reference phase measurement;
positioning the optical grating portion of the first object over the optical grating portion of the second object;
directing a third radiation beam through the optical grating portion of the first object and onto the optical grating portion of the second object from a third direction to produce a third diffracted beam;
directing a fourth radiation beam through the optical grating portion of the first object and onto the optical grating portion of the second object from a fourth direction different from the third direction to produce a fourth diffracted beam;
measuring the phase difference between the third and fourth diffracted beams to produce a control phase measurement;
comparing the control phase measurement with the reference phase measurement to produce a comparison phase measurement; and
moving the second object relative to the first object in the alignment direction until the comparison phase measurement is a selected value.

22. A method as claimed in claim 21, characterized in that:
the first and third diffracted beams are of a positive diffraction order; and
the second and fourth diffracted beams are not a positive diffraction order.

23. An apparatus for aligning first and second objects in an alignment direction, said first and second objects being parallel to each other and in different planes, said first object having an optical grating portion extending in the alignment direction, said second object having an optical grating portion extending in the alignment direction and having an optically smooth portion, said gratings having grating constants, said apparatus comprising:
 a source of first and second radiation beams;
 means for directing the first and second radiation beams in different directions through the optical grating portion of the first object and onto the second object to produce first and second diffracted beams; and
 means for measuring the phase difference between the first and second diffracted beams to produce a phase measurement.

* * * * *